United States Patent [19]

Gore

[11] Patent Number: 4,684,783

[45] Date of Patent: Aug. 4, 1987

[54] ENVIRONMENTAL CONTROL APPARATUS FOR ELECTRICAL CIRCUIT ELEMENTS

[75] Inventor: John G. Gore, Mount Dora, Fla.

[73] Assignee: Sawtek, Inc., Orlando, Fla.

[21] Appl. No.: 795,488

[22] Filed: Nov. 6, 1985

[51] Int. Cl.4 .............................................. F27D 11/02
[52] U.S. Cl. .................................... 219/210; 219/521; 219/385
[58] Field of Search ............... 219/209, 210, 200, 201, 219/385, 386, 521, 213

[56] References Cited

U.S. PATENT DOCUMENTS

| 1,967,185 | 7/1934 | Clapp | 219/210 |
| 2,050,633 | 8/1936 | Stallard | 219/209 |
| 3,155,157 | 11/1964 | Anderson | 219/210 |
| 4,374,316 | 2/1983 | Inamori | 219/210 |

Primary Examiner—E. A. Goldberg
Assistant Examiner—Teresa J. Walberg
Attorney, Agent, or Firm—Duckworth, Allen, Dyer

[57] ABSTRACT

An environmental control apparatus for electronic circuit elements includes an enclosure for the element and standoff brackets supporting the enclosure, the enclosure and support brackets together defining an area of both high heat resistivity and high heat conductivity, with a heating mechanism with the area of high heat conductivity in order to reduce the flow of heat and to maintain a balanced temperature profile along the enclosure.

17 Claims, 4 Drawing Figures

ENVIRONMENTAL CONTROL APPARATUS FOR ELECTRICAL CIRCUIT ELEMENTS

BACKGROUND OF THE INVENTION

1. Field of the Invention

The present invention relates generally to apparatus and methods for enclosing and packaging electronic circuit elements and relates specifically to apparatus and methods for controlling the environment surrounding the electronic circuit element within the enclosure or package.

2. Description of the Prior Art

A wide variety of enclosures and packages have been developed for electronic circuit elements such as semiconductor devices, piezoelectric devices and the like.

Under certain circumstances, electronic circuit elements are subjected to severe changes in environmental conditions. Not infrequently, those environmental conditions occur rapidly, as in the case of electronic circuit elements associated with circuitry aboard aircraft. Typically, the aircraft may be in an ambient temperature of between 60° and 100° F. while on the runway. In a short period of time, often less than 2 or three minutes after takeoff, the electronic circuit element may be subjected to severe freezing conditions representing a temperature swing of 100° F. or more. While some electronic circuit elements do not change their electronic characteristics under such severe temperature changes, certain types of electronic circuit elements will change operating chracteristics under these conditions. An example of such electronic circuit elements which are prone to change operating characteristics udner these circumstances are surface acoustic wave reflective array compressors and expanders, which are used in certain radar and other telemetry equipment on board aircraft.

It is known to provide enclosures for such electronic circuit elements which are prone to changes in operating characteristics in the presence of wide temperature variations. For example, it is known to place such electronic circuit elements in a sealed enclosure, and for providing heating means associated with the enclosure, and for controlling the operation of the heating means responsive to the required heat input to maintain the enclosure, and thus the electronic circuit element, within a desired temperature range. However, because of compexities of package design, requirements for rigidity and the like, such prior art arrangements have not been able to adequately maintain a relatively uniform temperature gradient across the entire enclosure for the electronic circuit element.

SUMMARY OF THE INVENTION

The present invention has as its purpose the provision for environmental control apparatus, and a related method, for electronic circuit elements subjected to the severe ambient conditions discussed above. This invention is particularly adapted for use with enclosures for electronic circuit elements which include areas of both high resistivity to heat flow and an area of high heat conductivity. In accordance with the present invention, means, and an associated method, are provided for heating the area of high heat conductivity in order to reduce the flow of heat from the enclosure. Means are further provided for controlling the heating means in order to maintain a balanced temperature profile along the heated enclosure.

In order to achieve these objectives in the apparatus of the present invention, means are further provided for sensing temperature in the area of heat conductivity.

By way of example, in the preferred embodiment of this invention, the area of high heat conductivity comprises a standoff bracket used to achieve the required mechanical rigidity necessary to support the heated enclosure for the electronic circuit element in accordance with desired mechanical stress requirements. The sensing means comprising a thermistor located immediately adjacent the interface between the standoff bracket and the enclosure for the electronic circuit element, in order to sense the temperature at the interface of the heated enclosure and the standoff bracket. The controlling means includes an output for energizing the heating means associated with the standoff bracket to initiate heating of the bracket and thereby block the flow of heat from the heated enclosure through the bracket.

Further in accordance with the preferred embodiment of this invention, the bracket is specifically designed to limit heat flow from the enclosure along the outer periphery of the bracket, with the heating means then being applied around the outer periphery of the bracket to directly block the flow of heat from the enclosure. This objective is achieved by providing a central hole in the bracket and thereafter fitting an insulator in the central hole, thus forcing heat flow from the enclosure to the outer peripheral portions of the bracket.

Under those circumstances where electrical signal conductor means, such as lead wires, extend through the thermally resistive portion of the enclosure to the outside, means are provided in accordance with this invention for heating those wires to further block the flow of heat from the heated enclosure to thereby increase the ability to maintain a constant temperature gradient profile the enclosure. Preferably, the means for heating the lead wires includes means for supporting the lead wires, and a heating mechanism in close proximity with the area of support of the lead wires. A sensor, such as a thermistor, is placed in close proximity to the lead wires in the support in order to sense the necessity for heating.

DESCRIPTION OF THE DRAWINGS

FIG. 4 is a side elevation, in cross-section, of a preferred embodiment of a standoff bracket in accordance with the present invention, and which is utilized in the construction shown in FIGS. 1-3.

DESCRIPTION OF THE PREFERRED EMBODIMENT

A description of the preferred embodiment will now be described with reference to the drawings.

Figure 1:
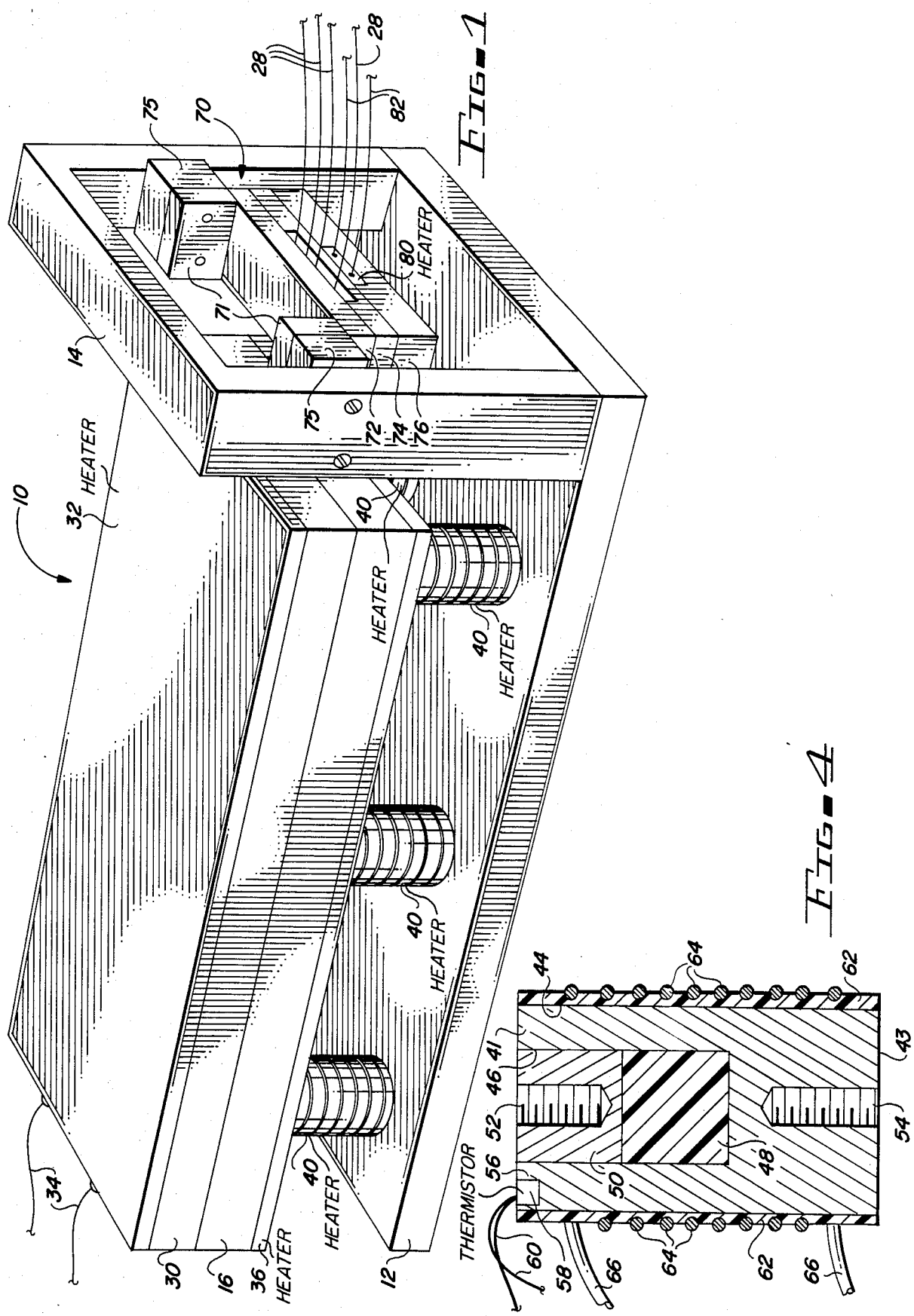
FIG. 1 is a perspective view of environmental control apparatus in accordance with the present invention.
Figure 2:
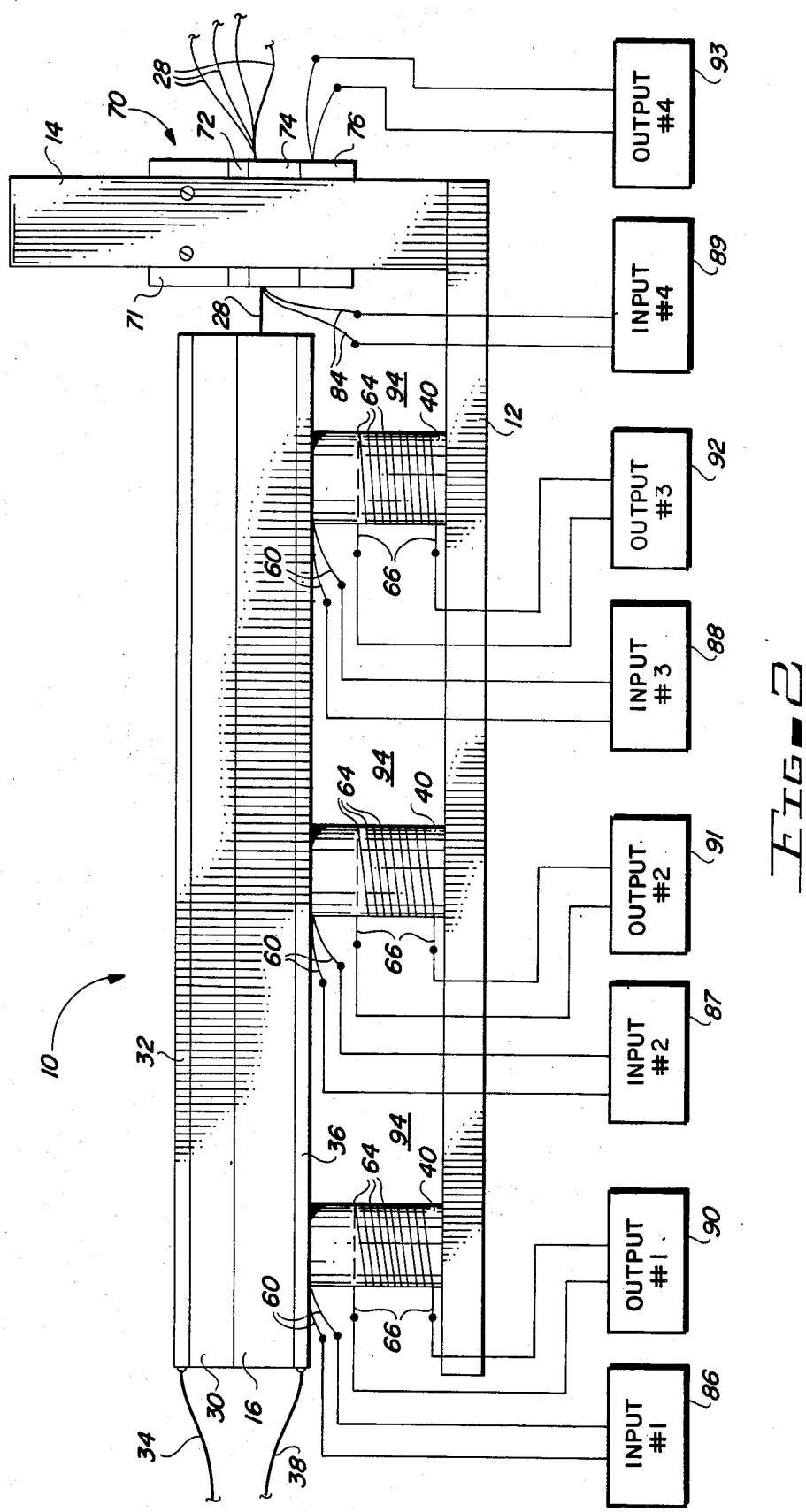
FIG. 2 is a side elevation of environmental control apparatus in accordance with the present invention, in which a portion of the electronic circuity associated therewith is shown by block diagram.
Figure 3:
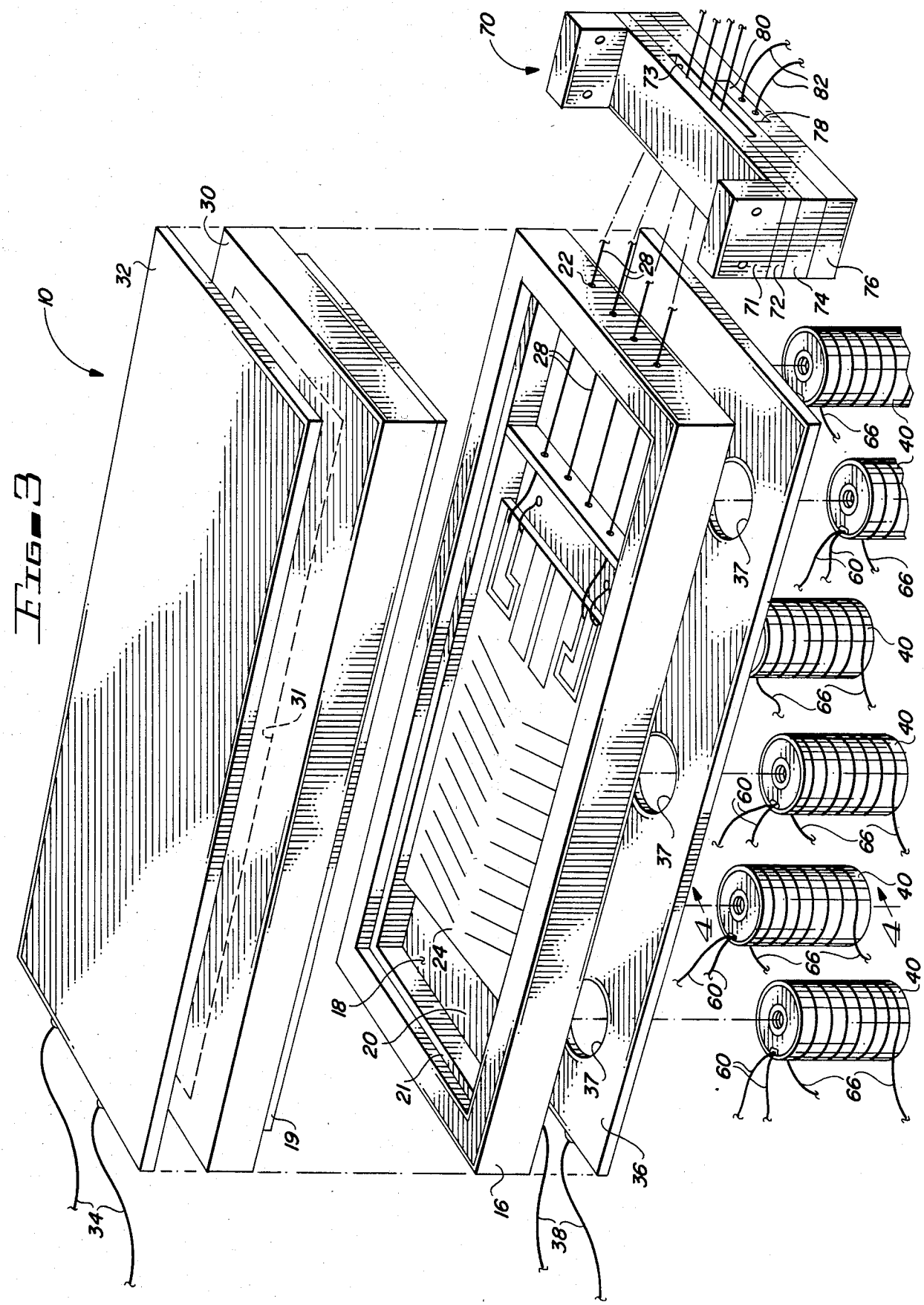
FIG. 3 is an exploded view of a portion of the environmental control apparatus shown in FIG. 1.

Noting FIGS. 1, 2 and 3, the environment control apparatus of the present invention, referred to generally by the reference numeral 10, includes an enclosure defined by bottom enclosure portion 16 and top enclosure portion 30. The bottom and top enclosure portions 16 and 30, respectively, are designed to mate in a sealing configuration.

As is shown in FIG. 3, the bottom enclosure portion includes an internal cavity 18 having a bottom surface 20 and lead wires 28 which pass through holes 22 at one end of the bottom enclosure portion 16, and which may include insulating material on the outer surface thereof at least in that portion of the lead wire 28 extending outside of the enclosure. As is shown to the right of the apparatus 10 in FIG. 3, a support member 70 is provided for the lead wire 28. This arrangement will be described in greater detail below.

The upper enclosure portion 30 may also include an internal cavity if required dimensionally to adequately receive an electronic circuit element therein.

An electronic circuit element 24 is shown mounted on the surface 20 of the bottom enclosure portion 16. While a variety of electronic circuit elements may be packaged in the apparatus 10, the electronic circuit element 24 is configured as a surface acoustic wave reflective array compressor 24, the operating characteristics of which are likely to be affected by wide temperature variations.

Referring again to FIGS. 1, 2, and 3, a heater element 32 is positioned across the top, outer surface of the upper enclosure portion 30. The heater 32 is a conventional heater element having an outer electrically insulated but heat-conductive surface with nichrome wires embedded within the insulative material and extending across the heater to provide heat to the upper enclosure portion 30. Lead wires 34 provide an electrical input to the heater 32.

A second heater 36 is mounted across the lower, outside surface of the bottom enclosure portion 16, and consists of a heater having an outer electrically insulated but heat-conductive surface with nichrome heating elements embedded therein. Lead wire 38 provides an electrical input to heater 36.

In order to mount the enclosure portions 16, 30 in a mechanically rigid condition, it is necessary to provide holes 38 in the lower heater element 36 in order to accommodate standoff brackets which mount the two enclosure portions 16, 30 in the desired mechanical configuration. Typically, the standoff brackets, such as brackets 40 shown in FIGS. 1, 2 and 3, and described in greater detail below with reference to FIG. 4, are formed of a high heat-conductivity metal. Under the severe mechanical stress conditions under which such electronic circuit element packages and enclosures are frequently subjected to, it is necessary that the standoff bracket be of a high tensile strength metal and be fastened to both an underlying support, such as support 12 in FIG. 2, by fasteners and other means having high mechanical strength. However, such fastening systems are of necessity formed of metals having high heat conductivity. When the standoff 40 is extended through the hole 38 in a mechanically coupled condition with the lower enclosure portion 16 to impart the desired mechanical rigidity, a significant amount of heat is lost through the standoff brackets 40, particularly where a number of standoff brackets (such as the six shown in FIGS. 1, 2, and 3) are required.

In accordance with the present invention, the standoff bracket is provided with heating means which effectively block the heat flow from the enclosure defined by portion 16, 30, to thereby permit a more uniform temperature profile to be maintained within the enclosure. As a result, better operating characteristics can be obtained from the electronic circuit element 24 mounted within the enclosure.

The construction of the bracket 40 and the associated heating and sensing means will now be described with reference to FIGS. 3 and 4.

Each of the standoff brackets 40 is fabricated from a high tensile strength metal member 42 having high heat conductivity characteristics. A central hole 46 is extended from the upper surface 41 through the center of the member 42 a sufficient distance to permit the insertion of a central insulating member 48 and a high tensile strength metal insert 50. The insert 50 includes a tapped hole 52 extending centrally therein, and which is adapted to receive a fastener extending through the lower enclosure portion 16 from the internal surface 20. Similarly, central hole 54 extends from the lower surface 43 of the member 42, in order to permit a fastener to extend through the support member 12 and into the bracket member 42. In this way, the enclosure defined by lower and upper portions 16, 30 are mechanically coupled to the support 12 in a rigid manner (note FIGS. 1 and 2).

The bracket member 42 is further provided with a small opening 56 along the upper surface 41 and adjacent the outer periphery 44. A thermistor 58 is positioned within the opening 56 and has associated lead wire 60 through which electrical signals representative of the temperature sensed by the thermistor 58 at the interface between the bracket 40 and the bottom surface of the bottom enclosure portion 16 is sensed.

The bracket 40 is further provided with heating means about the outer periphery thereof. Preferably, the heating means comprises a silicone insulative surface deposited on the outer periphery 44 of the member 42, with a nichrome wire wrapped about the outer periphery 44 of the member 42, and embedded in the silicone layer 62. It will be understood that the silicone layer is electrically insulated but relatively heat conductive, in order to permit heat generated by the passage of electrical current through the nichrome wire 64 to thereby heat the outer periphery 44 of the member 42. A similar silicone insulative layer may be deposited over the outside of the nichrome wire 64, but is not shown in FIG. 4. The nichrome heating wire 64 terminates in two leads 66.

As is shown in FIG. 2, each of the thermisters 58 are connected to a respective input, such as inputs 86–88, for example. Similarly, each of the nichrome heating wires 64 wrapped about an associated bracket 40 is coupled to a respective output, such as outputs 90–92, for example.

Further in accordance with the present invention, means are provided for heating lead wires 28 as those lead wires exit the enclosure. In accordance with the preferred embodiment of this invention, such heating means includes a heater support bracket 70, including support 71 having apertures adapted to mate with the upstanding support member 14 joined to the bottom support 12. The support member 70 includes sandwiched members 72, 74 and 76, with a slot 73 in member 74 for permitting the lead wire 28 exiting the enclosure to extend therethrough. Member 76 further includes a slot 78 adapted to receive a heater element 80, the operation of which heater element is controlled by lead wires 82. As is shown in FIG. 2, the support member 70 may also include a thermistor heat sensor having lead wires 84. The thermistor lead wires 84 are coupled to a control circuit input 89, and the lead wires of the heating element 80 are coupled to a control circuit output 93.

The temperature sensing inputs 86–89 and the electrical heating inputs 90–93 may be coupled to a conventional control system for receiving the various inputs and providing outputs to provide heating to any individual standoff bracket 40, or to the heater element 80 associated with the lead wires 28, or to operate all of the heaters simultaneously as required to provide a balanced temperature profile along the entire enclosure, thereby preventing the electronic circuit element 24 from being subjected to wide variations in temperature.

Typically, the areas surrounding the enclosure portion 16, 30, such as areas 94 between the support member 12 and the lower enclosure portion 16 and between the brackets 40 may be provided with an insulator. Similar insulating material may be fitted across the top of the heater 32.

It will be thus be understood that the present invention provides an enclosure for supporting an electronic circuit element and means for heating areas of high heat conductivity associated with the mechanical support for the enclosure in order to maintain a balanced temperature profile along the enclosure and around the electronic circuit element.

What is claimed is:

1. Environmental control apparatus for an electronic circuit element, said apparatus comprising:
   (a) an enclosure for supporting said electronic circuit element;
   (b) means including a standoff mounting bracket for supporting said enclosure, said enclosure and said supporting means including an area of high resistivity to heat flow and said standoff mounting bracket defining an area of high heat conductivity; and
   (c) means for heating said standoff mounting bracket in order to reduce the flow of heat from said enclosure.

2. The environmental control apparatus recited in claim 1 further comprising means for controlling said heating means in order to maintain a balanced temperature profile along said enclosure.

3. The enviromental control apparatus recited in claim 2 wherein said controlling means comprises means for sensing temperature in said area of high heat conductivity.

4. The environmental control apparatus recited in claim 3 further comprising means for heating said enclosure.

5. The environmental control apparatus recited in claim 1 further comprising means for limiting heat conductivity of said bracket to the outer periphery thereof.

6. The environmental control apparatus recited in claim 5 further comprising means for applying heat from said high heat conductivity heating means to the periphery of said bracket.

7. The environmental control apparatus recited in claim 1 further comprising:

(a) means extending through said enclosure for conducting electronic signals to and from said electronic circuit element; and
(b) means for heating said electronic signal conducting means to further reduce heat flow from said enclosure.

8. The environmental control apparatus in claim 7 wherein said signal conducting means comprising insulated lead wires.

9. The environmental control apparatus recited in claim 8 wherein said supporting means further supports said means for heating said insulated lead wires.

10. Environmental control apparatus, comprising:
    (a) an enclosure;
    (b) means for heating said enclosure during intermittent periods;
    (c) support means including a standoff mounting bracket with said enclosure, said enclosure and support means including an area of high resistivity to heat flow and said standoff mounting bracket defining an area of high heat conductivity;
    (d) means for heating said area of high heat conductivity in order to reduce the flow of heat from said enclosure; and
    (e) means for controlling said enclosure heating means and said high heat conductivity heating means in order to maintain the temperature in said enclosure relatively constant during changes in ambient temperature.

11. The environmental control apparatus recited in claim 10 wherein said controlling means comprises means for sensing temperature in said area of high heat conductivity.

12. The environmental control apparatus recited in claim 10 wherein said bracket includes means for limiting heat conductivity of said bracket to the outer periphery thereof.

13. The environmental control apparatus recited in claim 12 wherein said bracket heating means comprises a heating coil about the outer periphery thereof.

14. The environmental control apparatus recited in claim 12 further comprising a temperature sensor at the interface between the said heated enclosure and said bracket.

15. A method for controlling the environment of an enclosure for electronic circuit elements having supporting means including an area of high resistivity to heat and a standoff mounting bracket defining an area of high heat conductivity, said method comprising heating said standoff mounting bracket in order to maintain a relatively uniform temperature profile along said enclosure.

16. The method recited in claim 15 wherein said heating step further comprises heating the outer periphery of said bracket.

17. The method recited in claim 16 further comprising the step of insulating an interior portion of said mounting bracket in order to limit heat flow to the outer periphery of said bracket.

* * * * *